(12) United States Patent
Kanno et al.

(10) Patent No.: US 9,204,549 B2
(45) Date of Patent: Dec. 1, 2015

(54) SOCKET, CIRCUIT BOARD ASSEMBLY, AND APPARATUS HAVING THE SAME

(75) Inventors: Hideyuki Kanno, Tokyo (JP); Yoshiaki Ishiyama, Tokyo (JP)

(73) Assignee: Japan Aviation Electronics Industry, Limited, Tokyo (JP)

( * ) Notice: Subject to any disclaimer, the term of this patent is extended or adjusted under 35 U.S.C. 154(b) by 1182 days.

(21) Appl. No.: 12/803,723

(22) Filed: Jul. 2, 2010

(65) Prior Publication Data

US 2011/0013400 A1    Jan. 20, 2011

(30) Foreign Application Priority Data

Jul. 16, 2009  (JP) ................ 2009-167598

(51) Int. Cl.
| | |
|---|---|
| F21V 23/06 | (2006.01) |
| H05K 1/14 | (2006.01) |
| H01R 13/66 | (2006.01) |
| H01R 27/02 | (2006.01) |
| H05K 3/36 | (2006.01) |
| F21Y 101/02 | (2006.01) |
| F21Y 103/00 | (2006.01) |
| H05K 1/18 | (2006.01) |
| H05K 3/22 | (2006.01) |

(52) U.S. Cl.
CPC .............. *H05K 1/142* (2013.01); *F21V 23/06* (2013.01); *H01R 13/6658* (2013.01); *H01R 27/02* (2013.01); *H05K 3/368* (2013.01); *F21Y 2101/02* (2013.01); *F21Y 2103/003* (2013.01); *H05K 1/182* (2013.01); *H05K 3/222* (2013.01); *H05K 2201/10106* (2013.01); *H05K 2201/10189* (2013.01); *H05K 2201/10325* (2013.01)

(58) Field of Classification Search
CPC ........................... F21V 23/06; H01R 13/6658
See application file for complete search history.

(56) References Cited

U.S. PATENT DOCUMENTS

| | | | | |
|---|---|---|---|---|
| 5,310,355 | A | * | 5/1994 | Dannatt .................. 439/110 |
| 6,162,089 | A | | 12/2000 | Costello et al. |
| 6,422,716 | B2 | | 7/2002 | Henrici et al. |
| 2005/0265035 | A1 | * | 12/2005 | Brass et al. ................. 362/451 |
| 2007/0105408 | A1 | | 5/2007 | Ookura |

(Continued)

FOREIGN PATENT DOCUMENTS

| | | |
|---|---|---|
| DE | 100 12 734 | 9/2001 |
| DE | 10 2007 035 065 | 1/2009 |

(Continued)

OTHER PUBLICATIONS

Extended European Search Report dated Oct. 20, 2010.

(Continued)

*Primary Examiner* — Nimeshkumar Patel
*Assistant Examiner* — Jacob R Stern
(74) *Attorney, Agent, or Firm* — Collard & Roe, P.C.

(57) ABSTRACT

An apparatus has a plurality of types of plugs used for different purposes and a plurality of circuit board assemblies. Each of the plurality of the circuit board assemblies includes a circuit board having a plurality of wiring portions formed thereon, an electrical and electronic part mounted on the circuit board, and a plurality of sockets attached to the circuit board and connected to the electrical and electronic part via the plurality of wiring portions. The sockets included in all of the plurality of circuit board assemblies have the same shape and are configured to receive any of the plurality of types of plugs.

17 Claims, 15 Drawing Sheets

(56) References Cited

U.S. PATENT DOCUMENTS

| | | |
|---|---|---|
| 2007/0171667 A1 | 7/2007 | Watanabe et al. |
| 2008/0220631 A1 | 9/2008 | Isoda et al. |
| 2009/0047802 A1 | 2/2009 | Yen et al. |

FOREIGN PATENT DOCUMENTS

| | | |
|---|---|---|
| JP | 2007-200697 | 8/2007 |
| JP | 3150774 | 5/2009 |
| JP | 2010-198993 A | 9/2010 |
| KR | 1993-0000504 | 2/1993 |
| KR | 2008-0002125 | 6/2008 |
| TW | M357778 | 5/2009 |
| TW | M359635 | 6/2009 |

OTHER PUBLICATIONS

Taiwanese Office Action dated Mar. 29, 2013 in Taiwanese Patent Application No. 099121639 with English translation.

Japanese Office Action dated May 30, 2013 in Japanese Patent Application No. 2009-167598 with English translation.

Korean Office Action dated Dec. 12, 2011 in Korean Application No. 10-2010-0067183 with English translation.

* cited by examiner

SOCKET, CIRCUIT BOARD ASSEMBLY, AND APPARATUS HAVING THE SAME

CROSS REFERENCE TO RELATED APPLICATIONS

Applicants claim priority under 35 U.S.C. §119 of Japanese Patent Application No. JP2009-167598 filed Jul. 16, 2009.

BACKGROUND OF THE INVENTION

The present invention relates to a circuit board assembly in which sockets used for a plurality of types of plugs are attached to a circuit board. Furthermore, the present invention also relates to an apparatus having a plurality of circuit board assemblies connected to each other.

Generally, a socket or a connector is designed specifically for a limited type of an object to be connected. For example, a connector disclosed in JP-A 2007-200697 is designed to hold an LED device and to supply power to the LED device.

SUMMARY OF THE INVENTION

It is an object of the present invention to provide a socket suitable for use in an apparatus that combines a plurality of circuit board assemblies each having an electronic device such as an LED device mounted on a circuit board.

Another object of the present invention is to provide a circuit board assembly having the above-mentioned sockets.

Still another object of the present invention is to provide an apparatus having the above-mentioned circuit board assemblies.

A first aspect of the present invention provides an apparatus having a plurality of types of plugs used for different purposes and a plurality of circuit board assemblies. Each of the plurality of the circuit board assemblies includes a circuit board having a plurality of wiring portions formed thereon, an electrical and electronic part mounted on the circuit board, and a plurality of sockets attached to the circuit board and connected to the electrical and electronic part via the plurality of wiring portions. The sockets included in all of the plurality of circuit board assemblies have the same shape and are configured to receive any of the plurality of types of plugs.

A second aspect of the present invention provides a circuit board assembly including a plurality of sockets having the same shape and a circuit board having the plurality of sockets mounted thereon. Each of the plurality of sockets is configured to receive a plurality of types of plugs.

A third aspect of the present invention provides a socket configured to receive a plurality of types of plugs.

An appreciation of the objectives of the present invention and a more complete understanding of its structure may be had by studying the following description of the preferred embodiment and by referring to the accompanying drawings.

Figure 1:
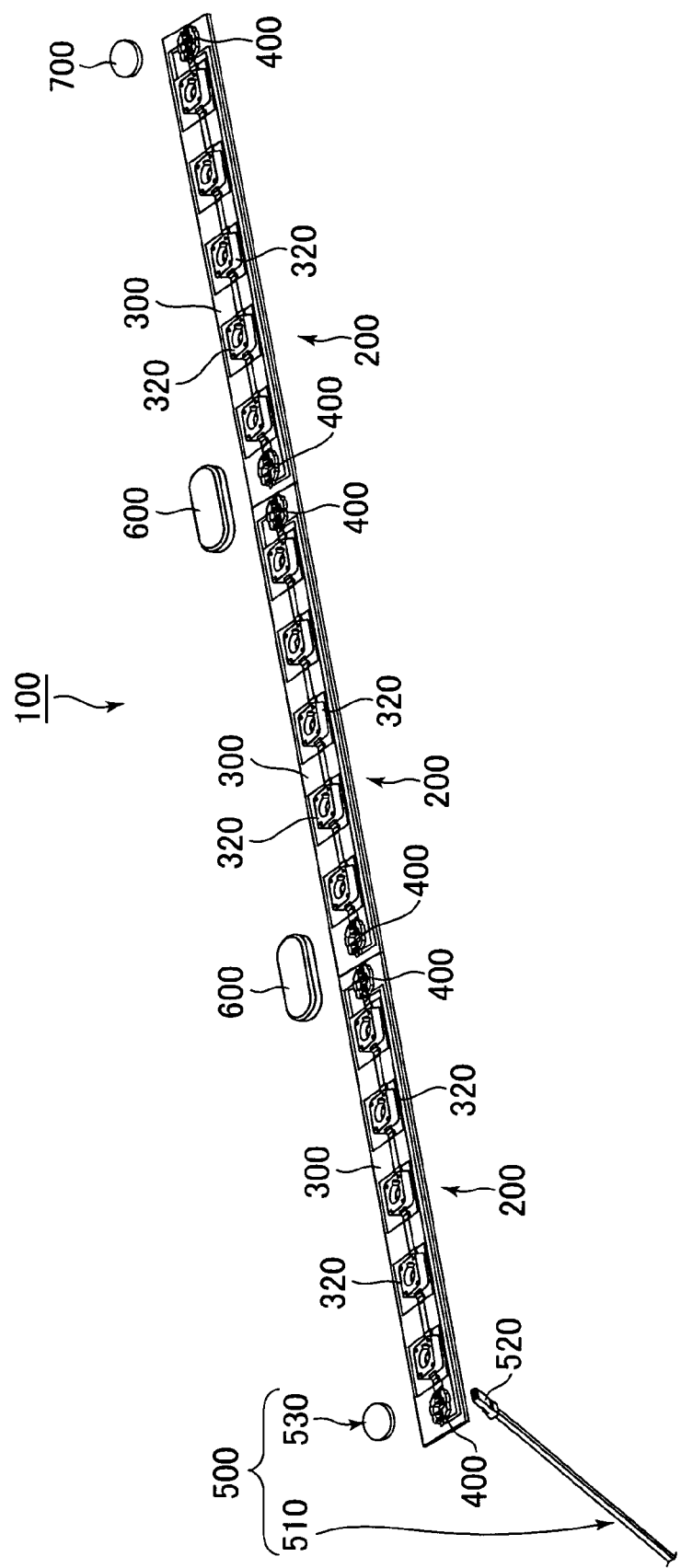
FIG. 1 is an exploded perspective view showing a summary of an apparatus according to a first embodiment of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF PREFERRED EMBODIMENTS

First Embodiment

As shown in FIG. 1, an apparatus 100 according to a first embodiment of the present invention includes a plurality of circuit board assemblies 200 and a plurality of plugs (including a feeder plug 500, connection plugs 600, and a short-circuit plug 700). As is apparent from FIG. 1, the feeder plug 500, the connection plugs 600, and the short-circuit plug 700 have different shapes and different purposes.

Figure 2:
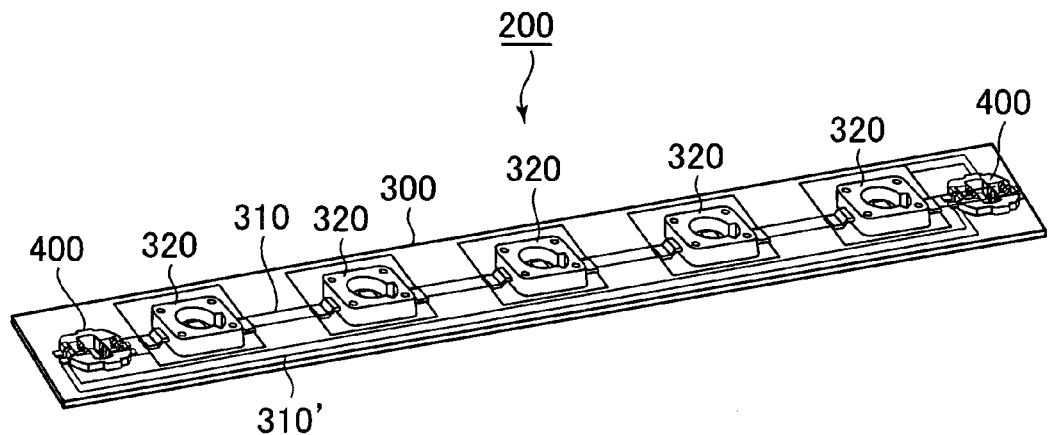
FIG. 2 is a perspective view showing a circuit board assembly included in the apparatus shown in FIG. 1.
Figure 5:
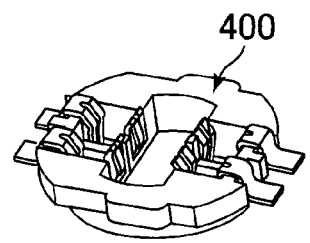
FIG. 5 is an exploded perspective view showing an end of a circuit board and the socket included in the circuit board assembly of FIG. 2.
Figure 5:
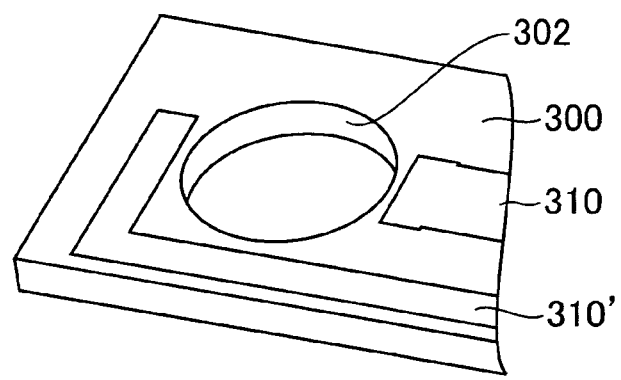

As shown in FIG. 2, the circuit board assemblies 200 of the present embodiment have the same structure. Each of the circuit board assemblies 200 has two long edges extending in a predetermined direction and two short edges extending in a direction perpendicular to the predetermined direction. In other words, the predetermined direction is a longitudinal direction of each circuit board assembly 200. Each of the circuit board assemblies 200 includes a circuit board 300 having a plurality of wiring portions 310 and 310' formed thereon, LED devices (electrical and electronic devices) 320 mounted on the circuit board 300, and two sockets 400 attached onto the circuit board 300. As shown in FIG. 5, the circuit board 300 according to the present embodiment has attachment holes 302 extending through the circuit board 300. The attachment holes 302 are used for attachment of the sockets 400. The attachment holes 302 are located near the respective short edges of the circuit board 300 in the predetermined direction.

As shown in FIG. 2, the sockets 400 have the same shape and structure. Each of the sockets 400 is connected to the LED devices 320 via the wiring portions 310 and 310'. As described in detail later, each of the sockets 400 has such a shape as to receive any of the feeder plug 500, the connection plugs 600, and the short-circuit plug 700 (see FIG. 1).

Figure 3:
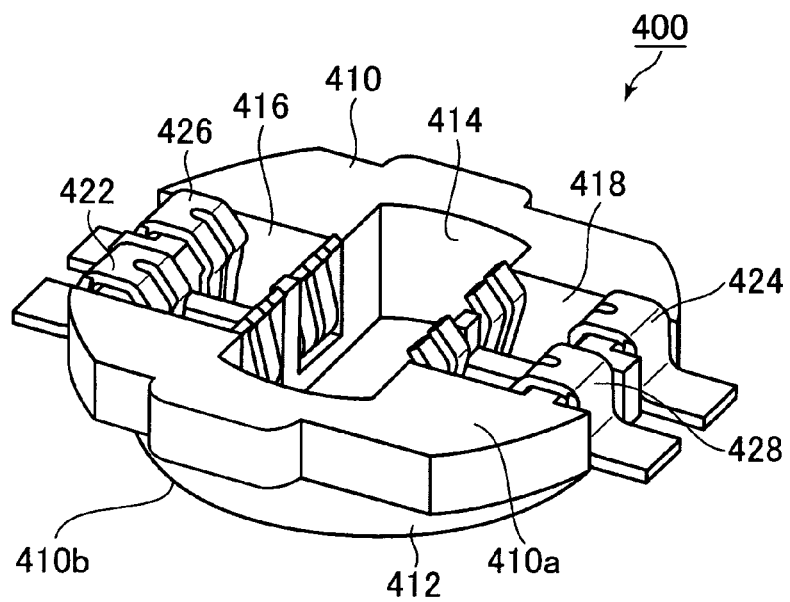
FIG. 3 is a perspective view showing a socket included in the circuit board assembly of FIG. 2.
Figure 4:
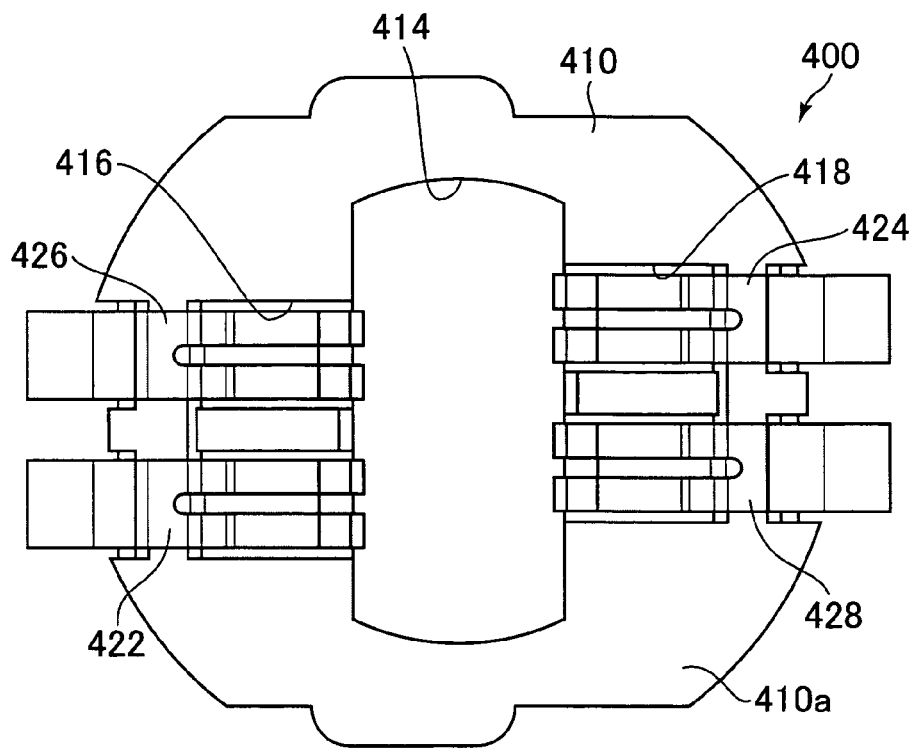
FIG. 4 is a plan view showing the socket of FIG. 3.

Specifically, as shown in FIGS. 3 and 4, each of the sockets 400 includes a base portion 410 formed of an insulator and four conductive terminals 422, 424, 426, and 428. The base portion 410 has an upper surface 410a, an attachment portion 412 with a lower surface 410b, a receiver hole 414 extending through the base portion 410 from the upper surface 410a to the lower surface 410b, and two recesses 416 and 418 recessed downward in the upper surface 410a. The attachment portion 412 is fitted into the attachment hole 302 of the circuit board 300. The receiver hole 414 is formed at a center of the socket 400 and is configured to receive part of the feeder plug 500 as described later. The receiver hole 414 of the present embodiment does not have a circular shape. As shown in FIG. 4, the shape of the receiver hole 414 of the present embodiment is substantially a rectangular shape extending in a lengthwise direction (i.e., vertical direction in FIG. 4). The recesses 416 and 418 are located so that the receiver hole 414 is interposed between the recesses 416 and 418 in a direction perpendicular to the lengthwise direction of the receiver hole 414 (i.e., horizontal direction in FIG. 4).

As shown in FIGS. 3 and 4, each of the terminals 422, 424, 426, and 428 extends along the direction perpendicular to the lengthwise direction of the receiver hole 414. Specifically, the terminal 422 and the terminal 426 extend from the receiver hole 414 toward the left side of FIG. 4 along the horizontal direction, whereas the terminal 424 and the terminal 428 extend from the receiver hole 414 toward the right side of FIG. 4 along the horizontal direction. In other words, the direction to which the terminal 422 and the terminal 426 extend from the receiver hole 414 is opposite to the direction to which the terminal 424 and the terminal 428 extend from the receiver hole 414. In the present embodiment, the terminal 422 and the terminal 424 are paired, and the terminal 426 and the terminal 428 are paired. As is apparent from FIG. 4, the pair of the terminals 422 and 424 are arranged symmetrically with respect to the center of the socket 400. Similarly, the pair of the terminals 426 and 428 are arranged symmetrically with respect to the center of the socket 400. In the present embodiment, the terminal 422 and the terminal 426 are held on the base portion 410 so that part of them is located within the recess 416. Similarly, the terminal 424 and the terminal 428 are held on the base portion 410 so that part of them is located within the recess 418. In the present embodiment, the recess 416 is located at a deviated position different from the position of the recess 418 in the lengthwise direction of the receiver hole 414. Thus, the terminals 422 and 426 are located at positions different from the positions of the terminals 424 and 428 in the lengthwise direction of the receiver hole 414. Furthermore, as can be seen from FIG. 5, the terminal 422 and the terminal 426 are connected in common to the wiring portion 310, and the terminal 424 and the terminal 428 are connected in common to the wiring portion 310'. The terminal 422 and the terminal 426 may be connected in common to the wiring portion 310', and the terminal 424 and the terminal 428 may be connected in common to the wiring portion 310. At that time, the lengthwise direction of the receiver hole 414 is perpendicular to the predetermined direction of the circuit board 300. As described later, the circuit boards 300 (the circuit board assemblies 200) are connected to each other along the predetermined direction of the circuit board 300 (the circuit board assembly 200). Thus, the lengthwise direction of the receiver hole 414 is perpendicular to a direction in which the circuit boards 300 (the circuit board assemblies 200) are connected to each other.

Figure 6:
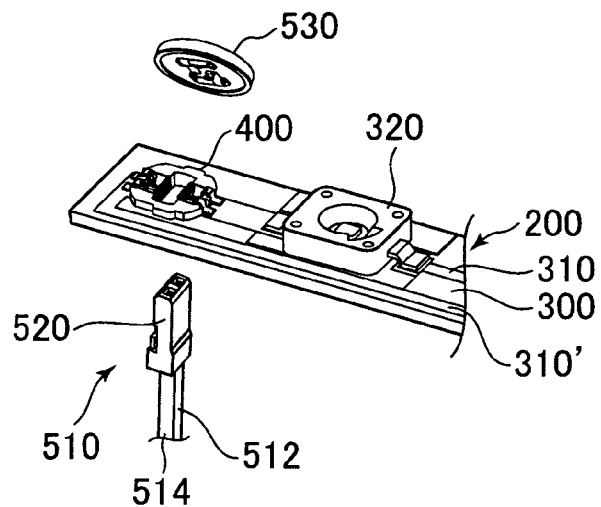
FIG. 6 is an exploded perspective view showing a feeder plug and the circuit board assembly of FIG. 2.
Figure 7:
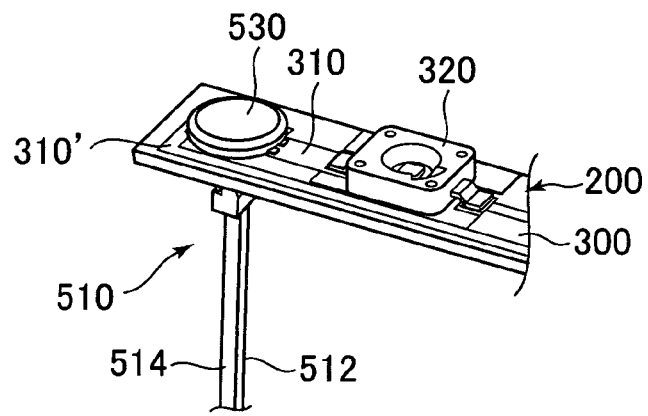
FIG. 7 is a perspective view showing the feeder plug and the circuit board assembly of FIG. 6.

As shown in FIGS. 1, 6, and 7, the feeder plug 500 is used to supply power to the circuit board assemblies 200. The feeder plug 500 includes a wire harness 510 for power supply and a feeder cap 530 to be fitted onto the socket 400.

Figure 8:
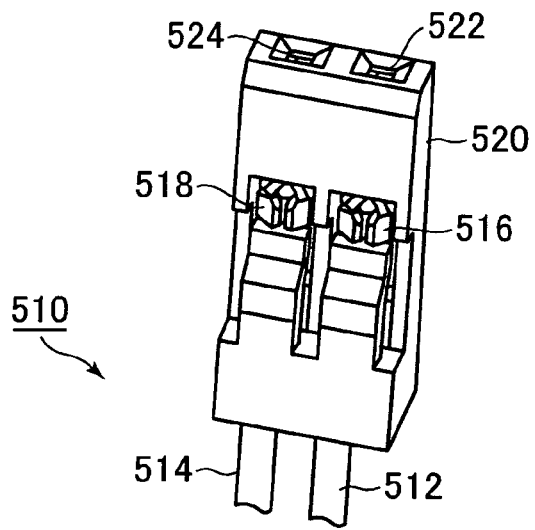
FIG. 8 is a perspective view showing a wire harness included in the feeder plug of FIG. 6.

As shown in FIG. 8, the wire harness 510 of the present embodiment includes feeder wires 512 and 514 for power supply, plug contacts 516 and 518 connected to the feeder wires 512 and 514, respectively, and an insulative plug body 520 configured to hold the feeder wires 512 and 514 and the plug contacts 516 and 518. The plug body 520 has holes 522 and 524 formed therein. Those holes 522 and 524 extend to reach the plug contacts 516 and 518, respectively. The plug body 520 of the present embodiment has a shape corresponding to the shape of the receiver hole 414 formed in the base portion 410 of the socket 400. Thus, the plug body 520 can be inserted into the receiver hole 414.

Figure 9:
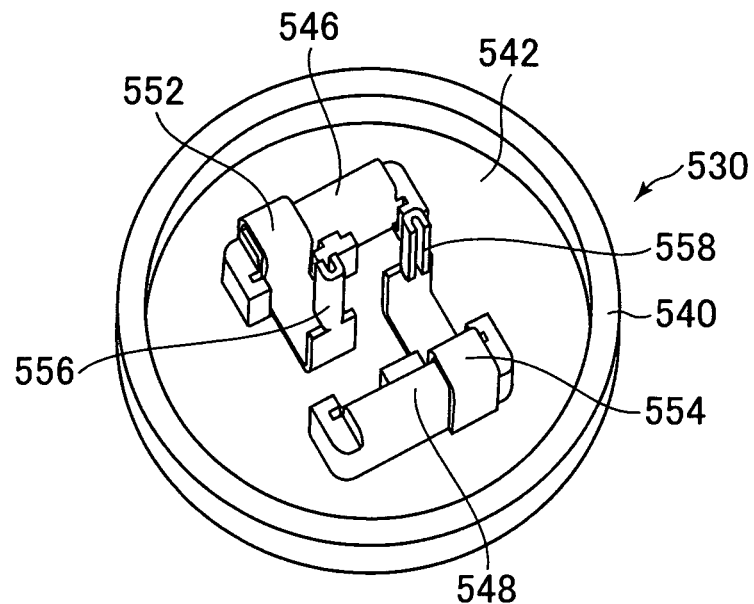
FIG. 9 is a perspective view showing a feeder cap included in the feeder plug of FIG. 6 as viewed from a lower side thereof.
Figure 10:
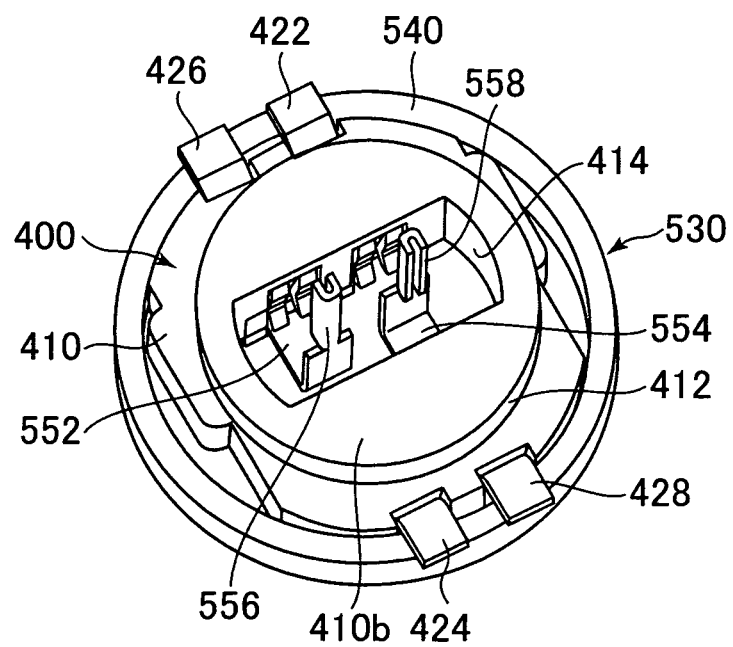
FIG. 10 is a perspective view showing the feeder cap of FIG. 9 in a state in which the feeder cap is fitted on the socket of FIG. 3 as viewed from the lower side thereof.

As shown in FIG. 9, the feeder cap 530 of the present embodiment includes an insulative feeder cover 540 and two conductive feeder contacts 552 and 554. The feeder cover 540 is used to cover the upper surface 410a of the base portion 410 of the socket 400. The feeder cover 540 has two protrusions 546 and 548 formed on a principal surface (lower surface) 542 thereof. The protrusions 546 and 548 have a shape that can be fitted in the recesses 416 and 418 formed in the base portion 410 of the socket 400, respectively. The feeder contacts 552 and 554 are held on the feeder cover 540 so as to extend over the protrusions 546 and 548, respectively. The feeder contacts 552 and 554 have pin portions 556 and 558, respectively. When the feeder contacts 552 and 554 are held on the feeder cover 540, the pin portions 556 and 558 extend along a direction perpendicular to the principal surface 542 of the feeder cover 540. As shown in FIG. 10, the locations of the pin portions 556 and 558 correspond to the receiver hole 414. Specifically, when the feeder cap 530 is attached to the upper surface of the socket 400, the pin portions 556 and 558 pass through the receiver hole 414 and project downward from the lower surface 410b of the base portion 410 of the socket 400. Therefore, as can be seen from FIGS. 6 and 7, the wire harness 510 is inserted into the receiver hole 414 of the socket 400 from a rear side (lower side) of the circuit board assembly 200. The pin portions 556 and 558 of the feeder contacts 552 and 554 are inserted into the holes 522 and 524 of the plug body 520, respectively, to thereby establish connection between the pin portions 556 and 558 and the plug contacts 516 and 518, respectively. Thus, the feeder plug 500 can be attached to the socket 400.

Figure 11:
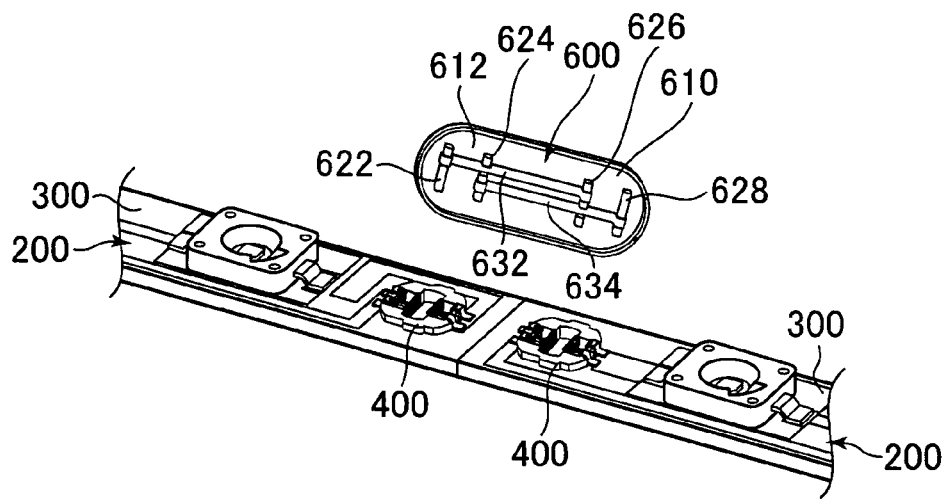
FIG. 11 is an exploded perspective view showing a connection plug and the circuit board assembly of FIG. 2.
Figure 12:
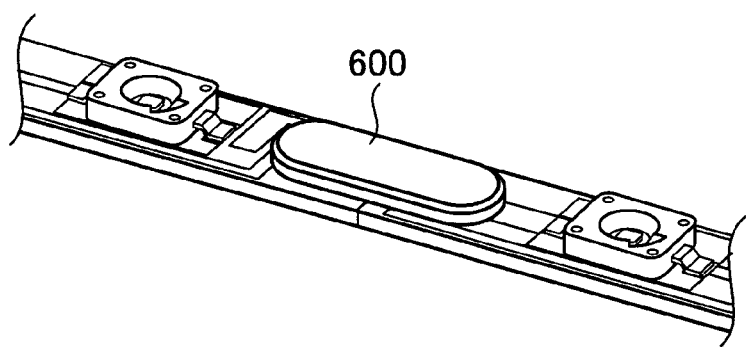
FIG. 12 is a perspective view showing the connection plug and the circuit board assembly of FIG. 11.

As shown in FIGS. 1, 11, and 12, the connection plug 600 is used to connect two sockets 400 which are included in different circuit board assemblies 200. Hereinafter, the different circuit board assemblies 200 are also referred to as a first circuit board assembly 200 and a second circuit board assembly 200, and the two sockets 400 are also referred to as a first socket 400 and a second socket 400. In other words, the first circuit board assembly 200 includes the first socket 400, the second circuit board assembly includes the second socket 400, and the connection plug 600 is used to bridge the first socket 400 and the second socket 400. In this embodiment, the connection plug 600 bridges the first socket 400 and the second socket 400 when a short edge of the circuit board 300 of the first circuit board assembly 200 face a short edge of the circuit board 300 of the second circuit board assembly 200 in the predetermined direction.

Figure 13:
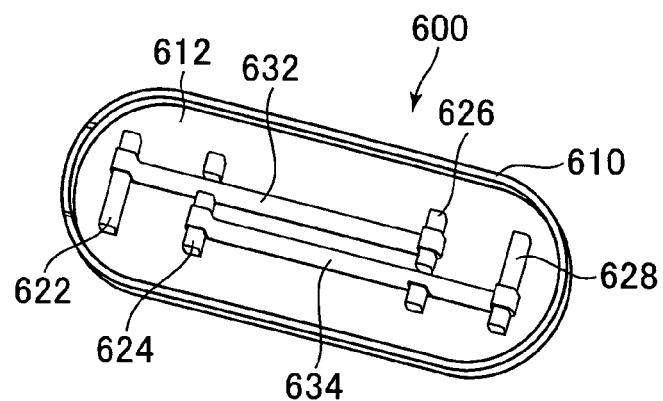
FIG. 13 is a perspective view showing the connection plug of FIG. 11 as viewed from a lower side thereof.

As shown in FIGS. 3 and 13, the connection plug 600 includes an insulative connection cover 610 and conductive connection contacts 632 and 634. The connection cover 610 is used to cover two sockets (i.e., the first socket and the second socket) 400 in a bridged manner. The connection cover 610 has four protrusions 622, 624, 626, and 628 formed on a principal surface (lower surface) 612 thereof. The protrusions 622 and 624 correspond to the recesses 416 and 418 of the first socket 400 and the protrusions 626 and 628 correspond to the recesses 416 and 418 of the second socket 400. Each of the connection contacts 632 and 634 is held on the connection cover 610. The connection contacts 632 and 634 extend parallel to each other. The illustrated connection contacts 632 and 634 have the same length. More specifically, the connection contact 632 extends from above the protrusion 622, which corresponds to the first socket 400, to above the protrusion 626, which corresponds to the second socket 400. Similarly, the connection contact 634 extends from above the protrusion 624, which corresponds to the first socket 400, to above the protrusion 628, which corresponds to the second socket 400. In other words, each of the connection contacts 632 and 634 covers one of the protrusions 622, 624 for the first socket 400 (first protrusions) and one of the protrusions 626, 628 for the second socket 400 (second protrusions) and extends between the covered first protrusion 622 (624) and the covered second protrusion 626 (628). Thus, when the connection plug 600 is attached over the two sockets 400, the connection contact 632 interconnects the terminals 422 (426) of the first socket 400 and the terminals 422 (426) of the second socket 400. At that time, the connection contact 634 interconnects the terminals 424 (428) of the first socket 400 and the terminals 424 (428) of the second socket 400. In the present embodiment, the length of the connection contact 632 is the same as the length of the connection contact 634 as described above. Specifically, a distance between the terminals 422 (426) connected by the connection contact 632 is the same as a distance between the terminals 424 (428) connected by the connection contact 634. Therefore, the connection plug 600 can be designed to be symmetric with respect to its center. Since the connection plug 600 has a structure symmetric with respect to its center, it can interconnect the two sockets (the first socket and the second socket) 400 even if it is rotated through 180 degrees.

Figure 14:
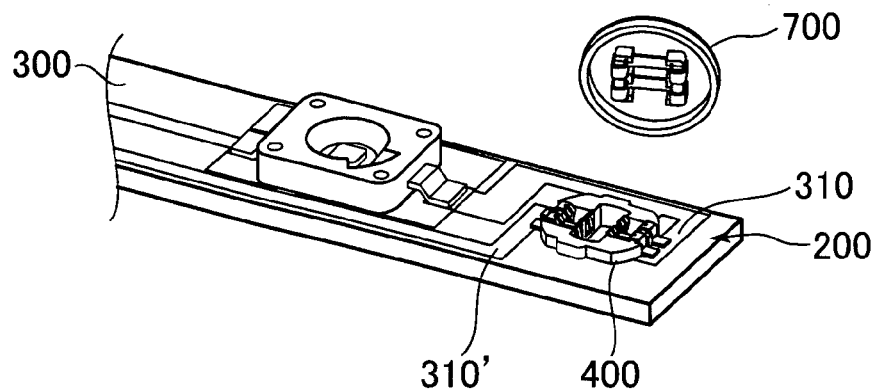
FIG. 14 is an exploded perspective view showing a short-circuit plug and the circuit board assembly of FIG. 2.
Figure 15:
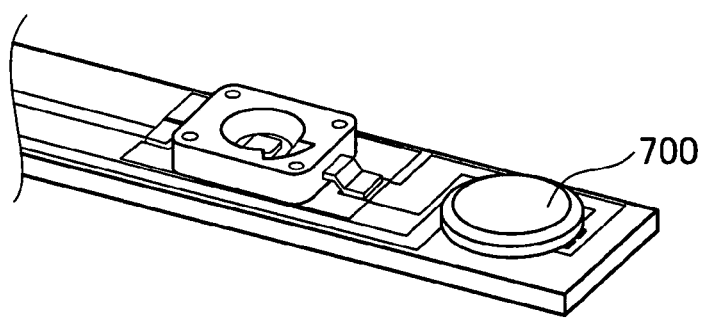
FIG. 15 is a perspective view showing the short-circuit plug and the circuit board assembly of FIG. 14.

As shown in FIGS. 1, 14, and 15, the short-circuit plug 700 is used to establish a short circuit between two wiring portions (electric paths) 310 and 310' on one circuit board assembly 200. Particularly, the short-circuit plug 700 of the present embodiment corresponds to one socket 400. The short-circuit plug 700 is configured to establish a short circuit between two wiring portions 310 and 310' in a state in which the short-circuit plug 700 is fitted on the socket 400.

Figure 16:
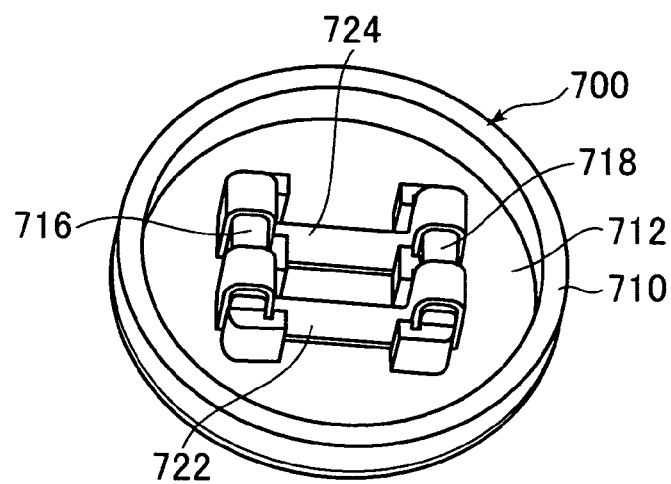
FIG. 16 is a perspective view showing the short-circuit plug as viewed from a lower side thereof.

As shown in FIGS. 3 and 16, the short-circuit plug 700 includes an insulative short-circuit cover 710 and conductive short-circuit contacts 722 and 724. The short-circuit cover 710 is used to cover the upper surface of the socket 400. The short-circuit cover 710 has protrusions 716 and 718 formed on a principal surface (lower surface) 712 thereof. The protrusions 716 and 718 correspond to the recesses 416 and 418 of the socket 400, respectively. The two short-circuit contacts 722 and 724 are arranged in parallel to each other. Each of the short-circuit contacts 722 and 724 extends from above the protrusion 716 to above the protrusion 718. Therefore, when the short-circuit plug 700 is attached to the socket 400, the terminals 422 and 426 located within the recess 416 of the socket 400 can be connected respectively to the terminals 428 and 424 within the recess 418 of the socket 400. In the present embodiment, the terminals 422 and 426 are connected in common to the wiring portion 310, and the other terminals 424 and 428 are connected in common to the wiring portion 310'. Therefore, two contacts may be crossed and substituted for the short-circuit contacts 722 and 724 of the present embodiment. Alternatively, a wide contact may be substituted for the short-circuit contacts 722 and 724 of the present embodiment.

Figure 17:
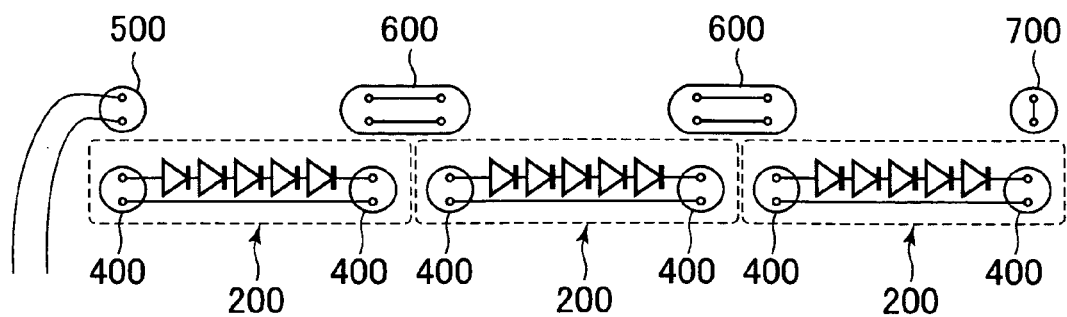
FIG. 17 is a diagram showing an equivalent circuit before circuit board assemblies, connection plugs, a feeder plug, and a short-circuit plug are combined with each other.
Figure 18:
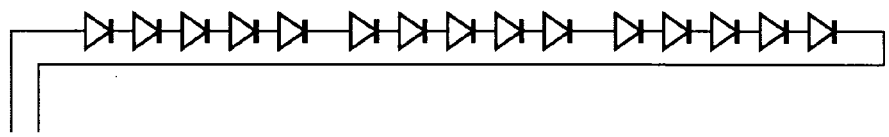
FIG. 18 is a diagram showing an equivalent circuit in a state in which the circuit board assemblies, the connection plugs, the feeder plug, and the short-circuit plug of FIG. 17 have been combined with each other.

Each of the circuit board assemblies 200, the feeder plug 500, the connection plugs 600, and the short-circuit plug 700 described above does not function as an electrical and electronic circuit (apparatus) before they are combined with each other as shown in FIG. 17. When the circuit board assemblies 200, the feeder plug 500, the connection plugs 600, and the short-circuit plug 700 are combined with each other, an electrical and electronic circuit (apparatus) is formed as shown in FIG. 18.

In the present embodiment, the sockets 400 are configured to cope with three types of plugs. Therefore, the number of types of parts or members can be reduced. Thus, cost reduction can be achieved.

Attachment of the sockets 400 to the circuit boards 300 is performed by a reflow process. Attachment of the feeder plug 500, the connection plugs 600, and the short-circuit plug 700 to the sockets 400 may not necessarily be performed during the reflow process and can be performed after the reflow process. Therefore, heat during the reflow process does not need to be considered at the time of selection of materials for the feeder cover 540 of the feeder plug 500 (the feeder cap 530 in particular), the connection cover 610 of the connection plug 600, and the short-circuit cover 710 of the short-circuit plug 700. In other words, according to the present embodiment, materials for the feeder cover 540, the connection cover 610, and the short-circuit cover 710, which include the uppermost surfaces of different types of plugs can be selected in view of required use without consideration of heat resistance. Therefore, a material that exhibits large suppression effect of diffused light reflection or a material that exhibits large light reflection effect may be used for the feeder cover 540, the connection cover 610, and the short-circuit cover 710. Furthermore, the aforementioned cover may contain a generally used material as a principal component, and a sheet that exhibits large suppression effect of diffused light reflection or a sheet that exhibits large light reflection effect may be attached to a surface of the cover. Moreover, the shape of the cover may be determined in view of required use. For example, in the present embodiment, each type of the covers is rounded at many portions so that no corners are formed at an area to which light is likely to be applied.

Furthermore, as described above with reference to FIG. 5, the attachment holes 302 are formed in the circuit board 300 for attachment of the base portion 410 of the socket 400 in the present embodiment. Therefore, the height of the socket 400 from the surface of the circuit board 300 can be reduced. Thus, upper surfaces of different types of plugs including the feeder plug 500, the connection plugs 600, and the short-circuit plug 700 can be located at a position lower than those of the LED devices 320. Accordingly, various types of plugs are prevented from deteriorating emission characteristics of the LED devices 320. If an attachment portion including a hole that does not penetrate the circuit board 300, rather than a through-hole, is provided in the circuit board 300, upper surfaces of different types of plugs can be located at a lower position as compared to a case of no attachment portion. The lower position of the upper surface of the plugs are also effective in the emission characteristics of the LED devices 320. If the sockets 400 can be reduced in height, the positions of upper surfaces of different types of plugs may be lowered without any specific attachment portion. The lower positions of the upper surfaces of the plugs are also effective in the emission characteristics of the LED devices 320.

Nevertheless, if no attachment holes 302 or equivalents are formed in the circuit board 300, the wire harness 510 cannot be inserted into the receiver hole 414 of the socket 400 from the rear side of the circuit board 300. In that case, a feeder plug 500' as shown in FIGS. 19 to 21 may be used instead of the aforementioned feeder plug 500.

Figure 19:
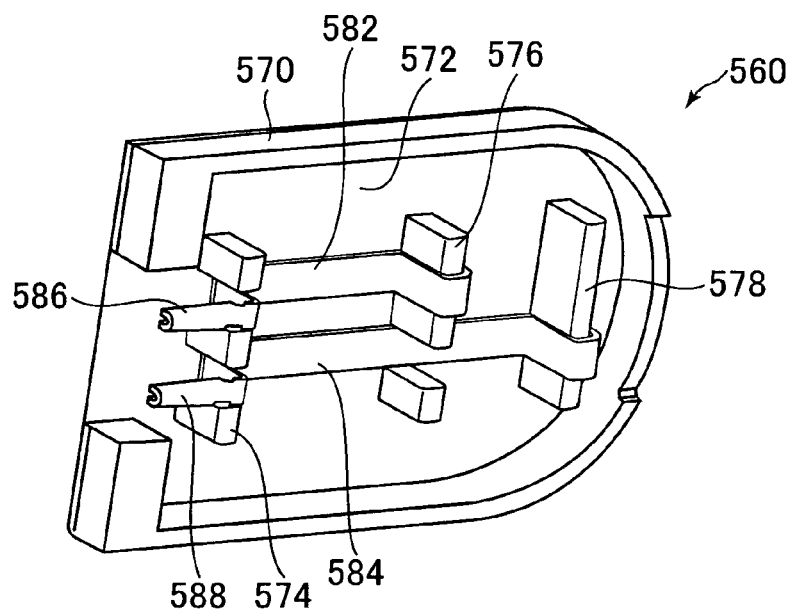
FIG. 19 is a perspective view showing a feeder cap in a variation of the feeder plug as viewed from a lower side thereof.
Figure 20:
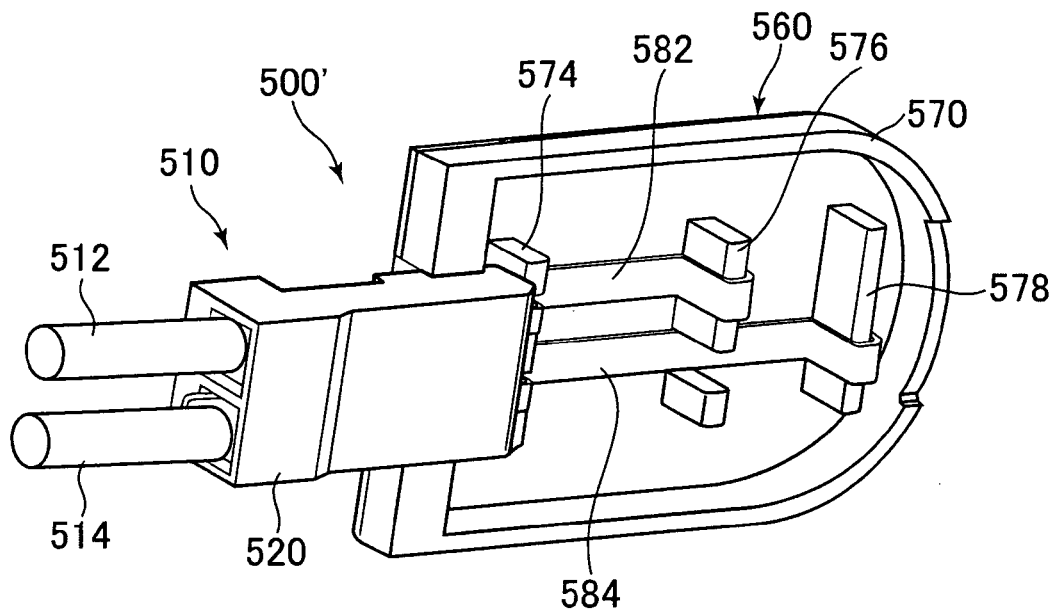
FIG. 20 is a perspective view showing a feeder plug using the feeder cap of FIG. 19 as viewed from a lower side thereof.
Figure 21:
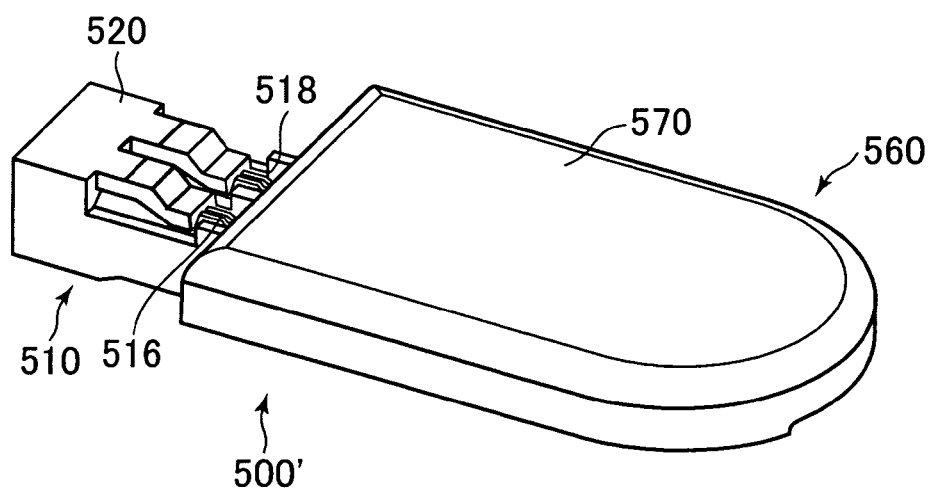
FIG. 21 is a perspective view showing the feeder plug of FIG. 20 as viewed from an upper side thereof. Wires of a wire harness are omitted from the illustration.

Referring to FIGS. 19 to 21, the feeder plug 500' has features in a feeder cap 560 as compared to the feeder plug 500 described with reference to FIGS. 6 to 10. The feeder plug 500' has a wire harness 510 with the same configuration as in the feeder plug 500.

As shown in FIGS. 3 and 19, the feeder cap 560 does not have a circular shape unlike the feeder cap 530. The feeder cap 560 has a specific shape in which a circular shape and a rectangular shape are joined together. Specifically, the feeder cap 560 includes a feeder cover 570 having a specific shape and feeder contacts 582 and 584. The feeder cover 570 has two protrusions 576 and 578 formed on a principal surface (lower surface) 572 thereof. The feeder cover 570 also has an abutment portion 574 projecting similarly to the protrusions 576 and 578. The protrusions 576 and 578 correspond to the recesses 416 and 418 of the socket 400, respectively. The abutment portion 574 is used to position the wire harness 510 with respect to the feeder cap 560 as described later. The feeder contact 582 extends over the protrusion 576, and the feeder contact 584 extends over the protrusion 578. Thus, when the feeder plug 500' is attached to the socket 400, the terminals 422 and 426 within the recess 416 can be connected to the feeder contact 582, and the terminals 424 and 428 within the recess 418 can be connected to the feeder contact 584. Furthermore, the feeder contact 582 has a pin portion 586 extending parallel to the principal surface 572 of the feeder cover 570 farther from the abutment portion 574. The feeder contact 584 has a pin portion 588 extending parallel to the principal surface 572 of the feeder cover 570 farther from the abutment portion 574. Those pin portions 586 and 588 are inserted into the holes 522 and 524 in the plug body 520 of the wire harness 510 and connected to the plug contacts 516 and 518, respectively. Thus, as shown in FIGS. 20 and 21, the wire harness 510 can be attached to the feeder cap 560 along a horizontal direction. At that time, the abutment portion 574 is brought into abutment against the plug body 520 of the wire harness 510 attached along the horizontal direction. Thus, the abutment portion 574 serves to position the plug body 520.

Figure 22:
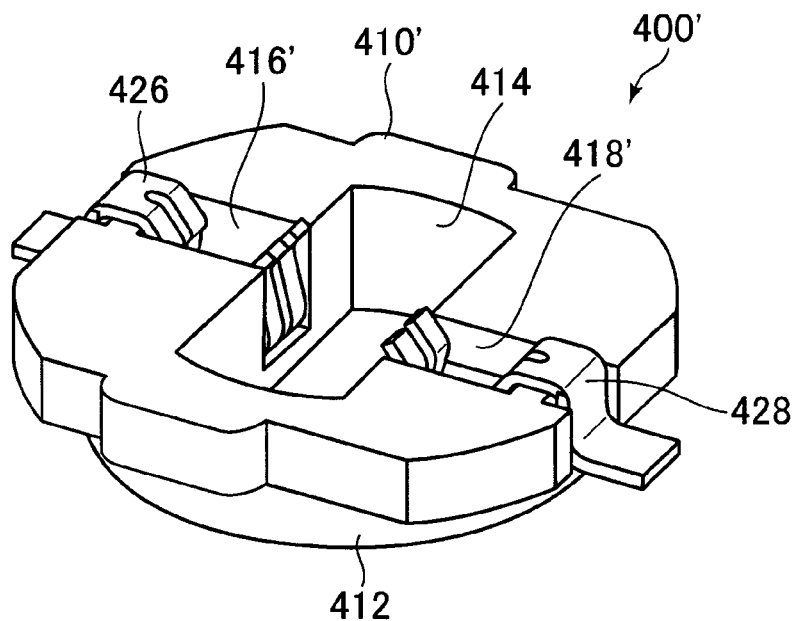
FIG. 22 is a perspective view showing a variation of the socket of FIG. 3.
Figure 23:
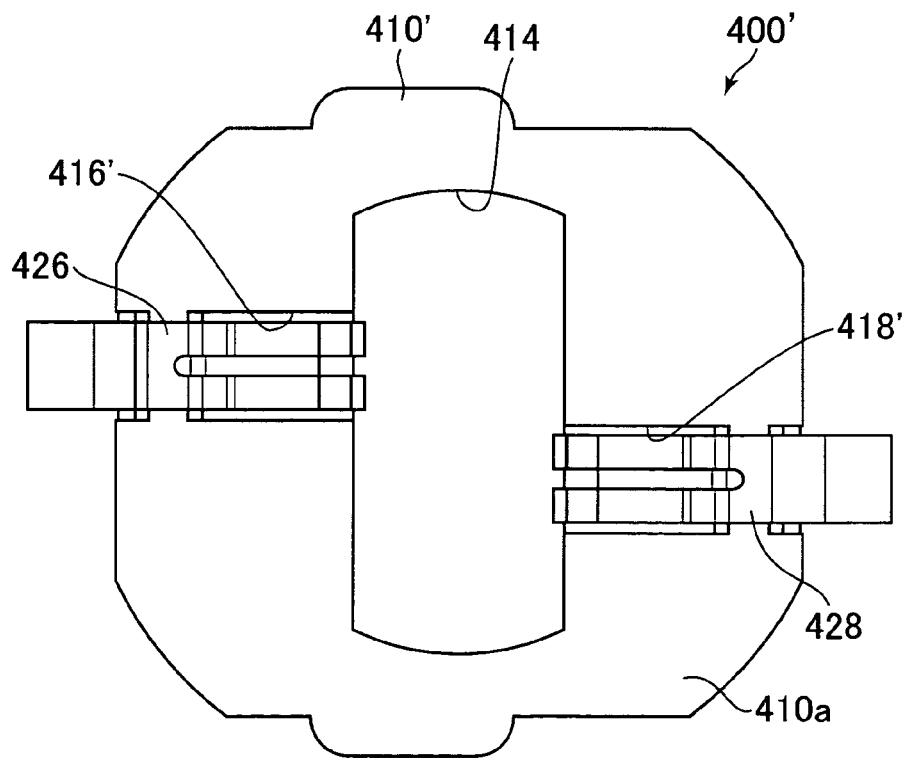
FIG. 23 is a plan view showing the socket of FIG. 22.

In the above embodiment, the four terminals 422, 424, 426, and 428 are provided on the socket 400 (see FIGS. 3 and 4). However, as shown in FIGS. 22 and 23, the socket may have only two terminals. The socket 400' shown in FIGS. 22 and 23 includes a base portion 410' having only two terminals 426 and 428. The recesses 416' and 418', which receive those terminals 426 and 428, are reduced in size. In this case, the terminal 426 and 428 are also arranged symmetrically with respect to the center of the socket 400. In order for the aforementioned feeder plug 500 and the connection plug 600 to cope with the socket 400', the shapes of the protrusions 546, 548, 622, 624, 626, and 628 of the feeder plug 500 and the connection plug 600 are changed so as to correspond to the recesses 416' and 418'. Furthermore, in order for the aforementioned short-circuit plug 700 to cope with the socket 400', the shapes of the protrusions 716 and 718 are changed so as to correspond to the recesses 416' and 418'. The short-circuit contacts 722 and 724 are unified, and the unified short-circuit contact is arranged so as to extend over both of the protrusions (716 and 718). The present invention is not limited to those examples. The socket may have a number of terminals.

Second Embodiment

Figure 24:
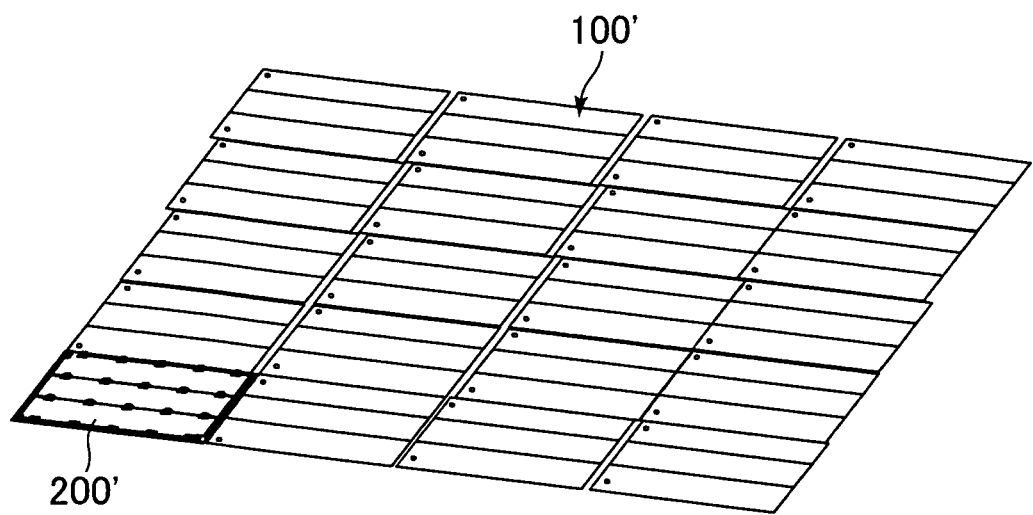
FIG. 24 is an exploded perspective view showing a summary of an apparatus according to a second embodiment of the present invention. Various types of plugs are omitted from the illustration.
Figure 25:
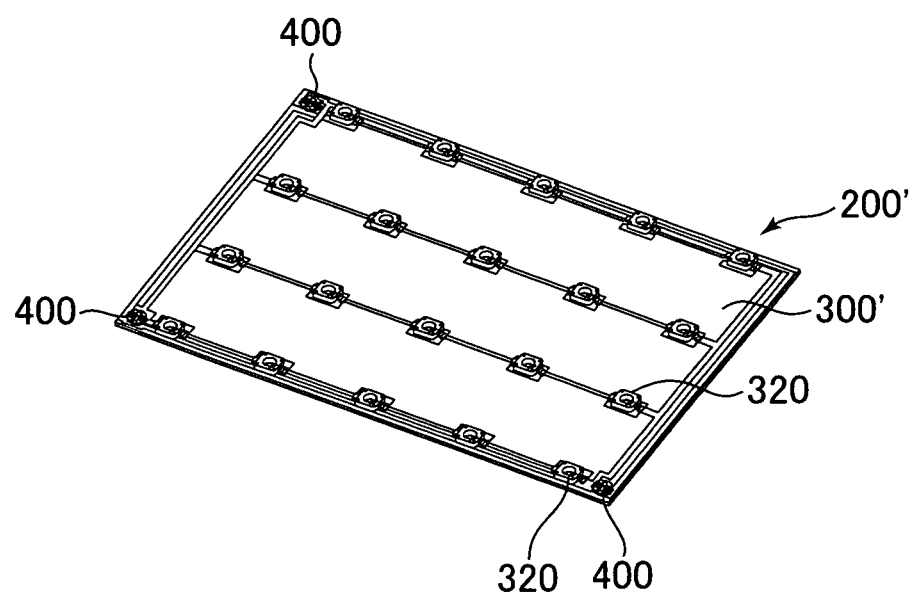
FIG. 25 is a perspective view showing an example of a circuit board assembly included in the apparatus of FIG. 24.

In the apparatus according to the aforementioned first embodiment, the circuit board assemblies 200 are arranged (one-dimensionally) in one direction. As shown in FIGS. 24 and 25, in an apparatus 100' according to a second embodiment of the present invention, circuit board assemblies 200' are arranged (two-dimensionally) in two directions, i.e., longitudinal direction and lateral direction. Components similar to those in the first embodiment are denoted by the same reference numerals in FIGS. 24 and 25, and the explanation thereof is omitted herein.

Figure 26:
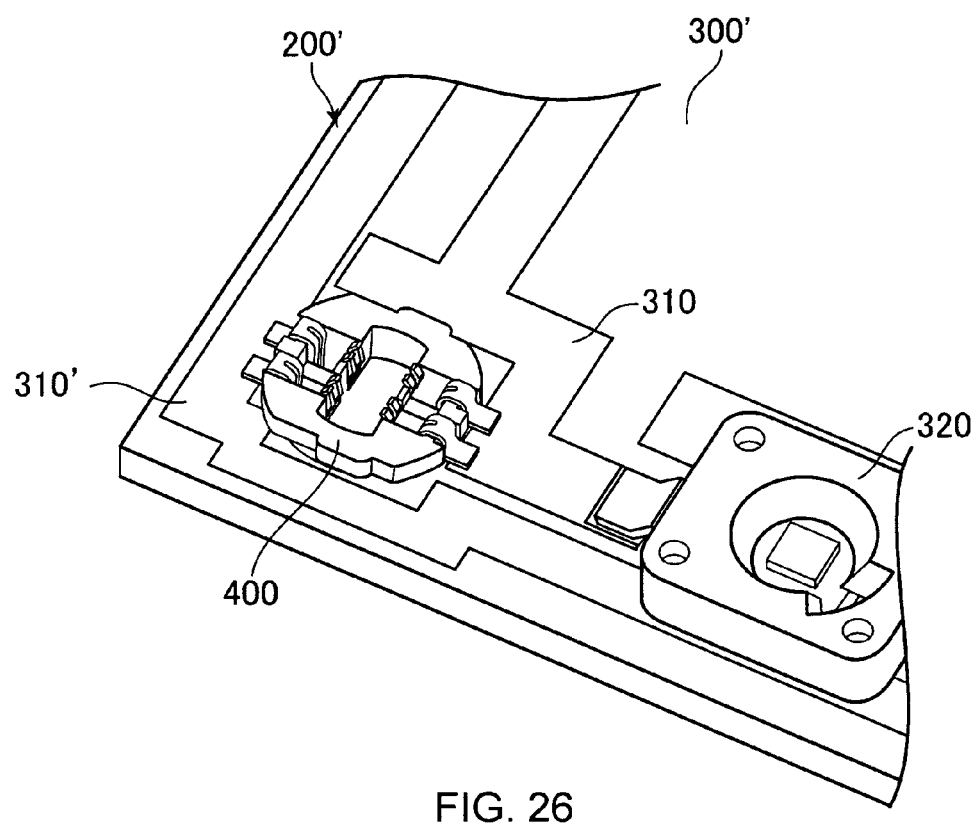
FIG. 26 is a perspective view showing a corner of the circuit board assembly of FIG. 25.
Figure 27:
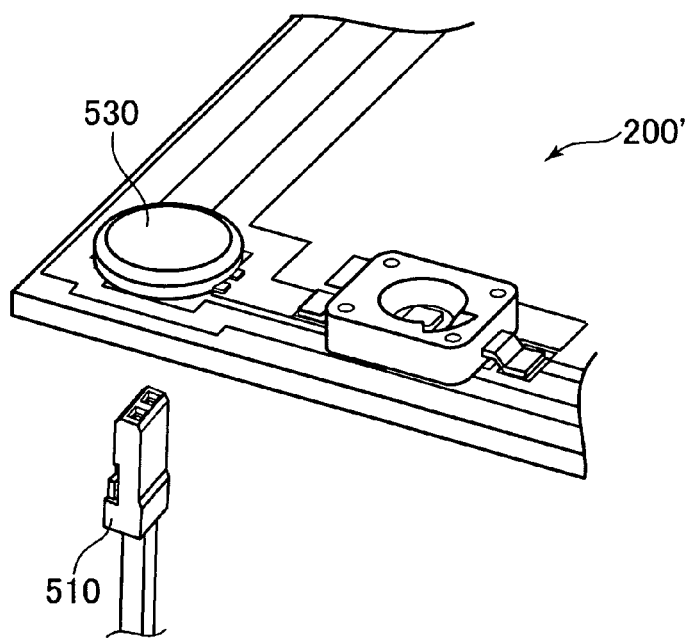
FIG. 27 is an exploded perspective view showing the circuit board assembly of FIG. 26 and the feeder plug of FIG. 6.
Figure 28:
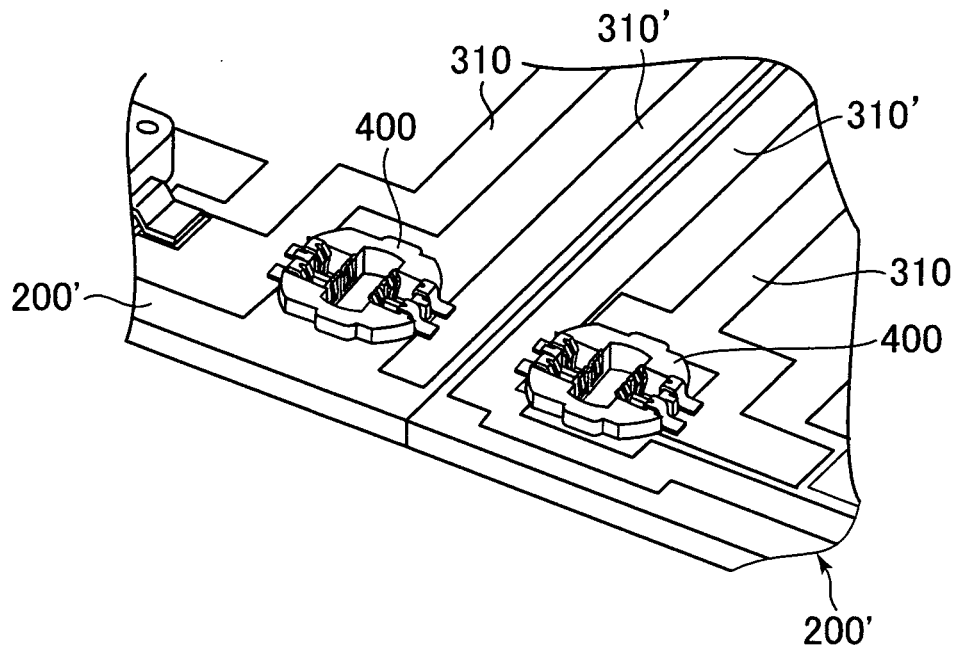
FIG. 28 is a perspective view showing corners of two circuit board assemblies included in the apparatus of FIG. 24. The circuit board assemblies are adjacent to each other in a longitudinal direction.
Figure 29:
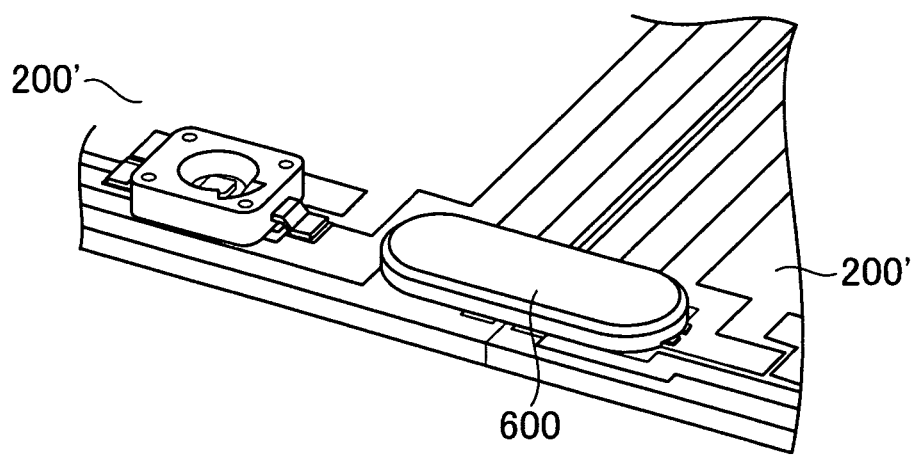
FIG. 29 is a perspective view showing the circuit board assemblies of FIG. 28 and the connection plug of FIG. 11.
Figure 30:
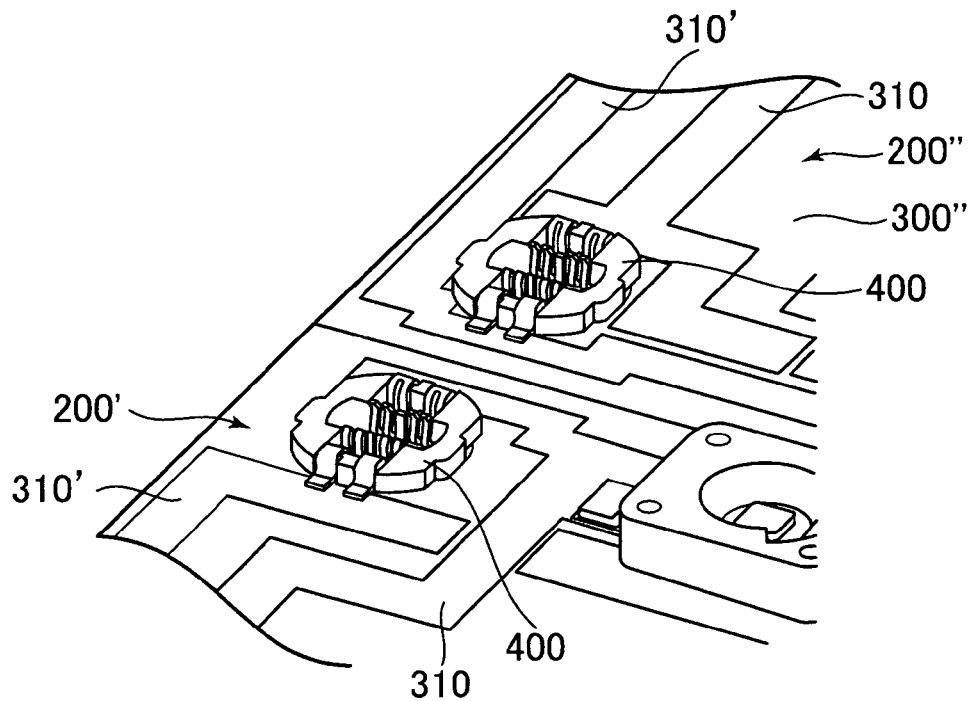
FIG. 30 is a perspective view corners of two circuit board assemblies included in the apparatus of FIG. 24. The circuit board assemblies are adjacent to each other in a lateral direction.
Figure 31:
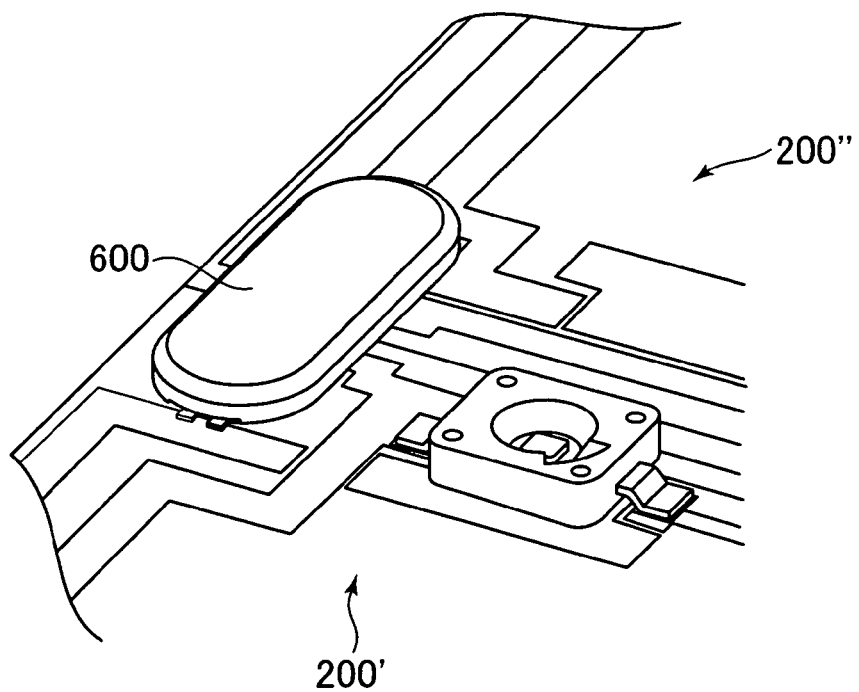
FIG. 31 is a perspective view showing the circuit board assemblies of FIG. 30 and the connection plug of FIG. 11.

Although circuit board assemblies according to the present embodiment slightly differs in arrangement of components or the like depending upon a direction in which the circuit board assemblies is connected to each other, they basically have a configuration as shown in FIG. 25. Specifically, referring to FIG. 25, the circuit board assembly 200' has a circuit in which four lines of LED devices 320 are connected in parallel on a circuit board 300'. Sockets 400 are disposed near corners of the circuit board 300'. In the illustrated example, one line of LED devices includes five LED devices 320. Each of the sockets 400 has the same structure as in the first embodiment. Therefore, the feeder plug 500, the connection plug 600, and the short-circuit plug 700 in the first embodiment can be used in the same manner. For example, with regard to the feeder plug 500, the wire harness 510 can be attached from a lower side of the circuit board assembly 200' (from a rear side of the apparatus) and combined with the feeder cap 530 attached to the socket 400 as shown in FIGS. 26 and 27. In the present embodiment, the circuit board assemblies are connected to each other with use of the same connection plug 600 as in the first embodiment. However, unlike the first embodiment, the circuit board assemblies are connected to each other not only in the longitudinal direction, but also in the lateral direction. In this case, different types of sockets 400 or connection plugs 600 do not need to be prepared if the sockets 400 are arranged differently and the layout of wiring portions on the circuit boards is accordingly changed to a slight degree. FIGS. 28 and 29 relate to connection in the longitudinal direction, and FIGS. 30 and 31 relate to connection in the lateral direction. As can be seen from comparison of those connections, the arrangement of the sockets 400 differs between the connection in the longitudinal direction and the connection in the lateral direction. Specifically, in the case of the connection in the longitudinal direction, the lengthwise direction of the receiver holes 414 in the sockets 400 is directed in the lateral direction. In the case of the connection in the lateral direction, the lengthwise direction of the receiver holes 414 in the sockets 400 is directed in the longitudinal direction. That is, in either case, the connection plug 600 is also arranged so that the protrusions (622, 624, 626, and 628) correspond to the recesses (416 and 418) of the sockets. Thus, the connection plug 600 having the same shape can be used for either connection. For this connection, a circuit board 300" in which the wiring portion 310 has a different shape may be prepared. The wiring portion 310 may be designed so as to have an L-shape near the socket 400, so that the socket 400 can be connected to the same wiring portions 310 and 310' as shown in FIGS. 26 and 30 even if the socket 400 is rotated through 90 degrees. Thus, the shape of the wiring portions 310 and 310' does not need to be changed for each direction of connection. Accordingly, the number of types of circuit boards can be prevented from increasing.

Figure 32:
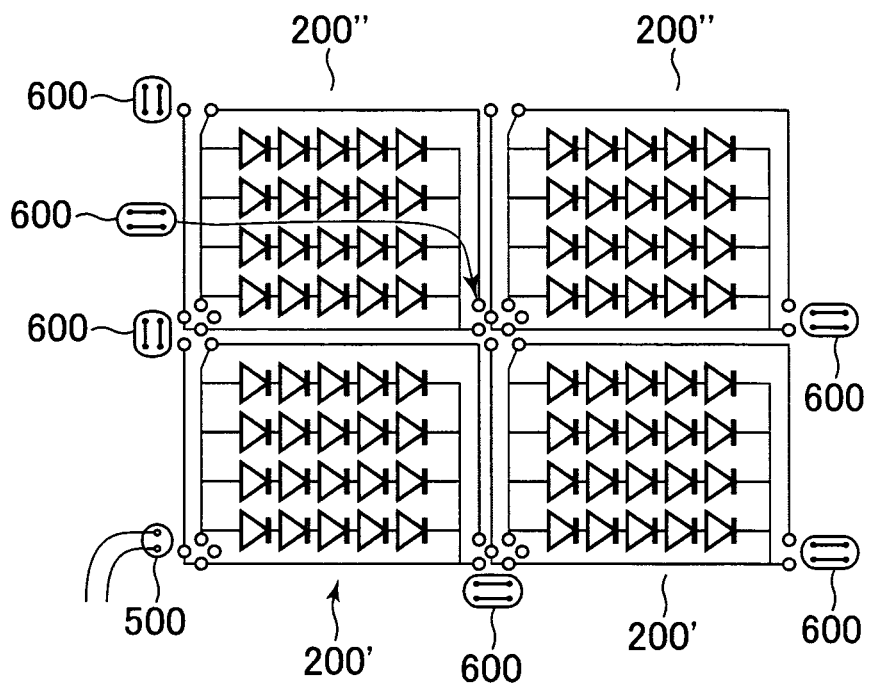
FIG. 32 is a diagram showing an equivalent circuit before circuit board assemblies, connection plugs, and a feeder plug are combined with each other.
Figure 33:
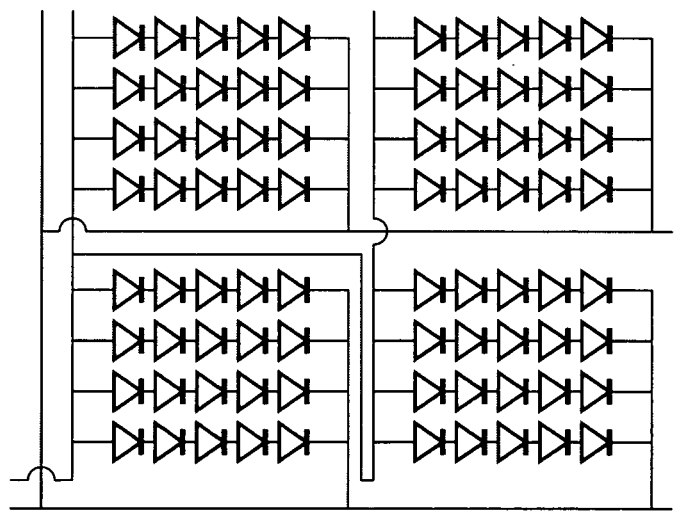
FIG. 33 is a diagram showing an equivalent circuit in a state in which the circuit board assemblies, the connection plugs, and the feeder plug of FIG. 32 have been combined with each other.

Part of the apparatus 100' thus constructed will be described in view of an equivalent circuit with reference to FIGS. 32 and 33. When circuit board assemblies 200' and 200" are connected to each other with the feeder plug 500 and the connection plugs 600 as shown in FIG. 32, the apparatus has an equivalent circuit as shown in FIG. 33. Specifically, according to the present embodiment, various apparatuses having different sizes can readily be designed by combining parts such as a plurality of circuit board assemblies. Additionally, types of parts used to produce the apparatus are minimized by the commonality of parts. Accordingly, cost for parts can be reduced. Hence, cost for production of the apparatus can be reduced.

According to the present invention, the shape and structure of sockets are common to a plurality of types of plugs. Therefore, sockets can be generalized, and the commonality of sockets can be increased. For example, according to the present invention, when a plurality of circuit board assemblies each having an LED device mounted thereon are combined to produce an apparatus such as a backlight apparatus, the number of types of parts used in the apparatus is reduced. Accordingly, the overall cost of the apparatus can be reduced.

The present application is based on a Japanese patent application of JP2009-167598 filed before the Japan Patent Office on Jul. 16, 2009, the contents of which are incorporated herein by reference.

While there has been described what is believed to be the preferred embodiment of the invention, those skilled in the art will recognize that other and further modifications may be made thereto without departing from the spirit of the invention, and it is intended to claim all such embodiments that fall within the true scope of the invention.

What is claimed is:

1. An apparatus comprising a plurality of types of plugs used for different purposes and a plurality of a circuit board assemblies,
    wherein each of the plurality of the circuit board assemblies includes a circuit board, an electrical/electronic device and a plurality of sockets,
    wherein the circuit board has a plurality of wiring portions formed thereon,
    wherein the electrical/electronic device is mounted on the circuit board,
    wherein the sockets are attached to an upper portion of the circuit board and connected to the electrical/electronic device via the plurality of wiring portions,
    wherein the sockets included in all of the plurality of circuit board assemblies have a common shape and structure that is designed to receive any of the plurality of types of plugs,
    wherein each of the sockets comprises an insulative base portion and at least two primary terminals, the insulative base portion having at least two recesses formed in an upper surface thereof, the at least two primary terminals being held on the base portion so that part of the primary terminals is located within the recesses, the at least two recesses being located so that a center of the socket is interposed therebetween, the at least two primary terminals being connected to the wiring portions of the circuit board to which the socket is attached, each of the plurality of types of plugs having protrusions which are fitted in the recesses, and
    wherein the plurality of types of plugs include a connection plug for connection between two circuit board assemblies, a feeder plug for power supply, and a short-circuit plug for establishing a short circuit between two electric paths on one circuit board assembly.

2. The apparatus as recited in claim 1, wherein the at least two primary terminals in each of the sockets are arranged symmetrically with respect to the center of the socket and are respectively connected to different ones of the wiring portions.

3. The apparatus as recited in claim 2, wherein:
    the at least two primary terminals comprise a first primary terminal and a second primary terminal;
    the wiring portions include a first wiring portion and a second wiring portion;
    each of the sockets further comprises a first auxiliary terminal and a second auxiliary terminal which are arranged symmetrically with respect to the center of the socket;
    the first primary terminal and the first auxiliary terminal are connected in common to the first wiring portion; and
    the second primary terminal and the second auxiliary terminal are connected in common to the second wiring portion.

4. The apparatus as recited in claim 1, wherein:
the feeder plug comprises feeder wires for power supply, plug contacts, a plug body, and a feeder cap;
the plug contacts are connected to the feeder wires;
the plug body is configured to hold the feeder wires and the plug contacts;
the feeder cap is fitted on the socket;
the feeder cap comprises a feeder cover and a plurality of feeder contacts;
the feeder cover is designed to cover an upper surface of the socket;
the feeder cover has the protrusions formed thereon;
the feeder contacts are held on the feeder cover and are connected to the respective plug contacts; and
each of the plurality of feeder contacts extends over the protrusion so that the feeder contact is connected to the primary terminal located within the recess when the feeder cap is attached to the socket.

5. The apparatus as recited in claim 4, wherein:
each of the plurality of feeder contacts includes a pin portion extending in a direction perpendicular to a principal surface of the feeder cover;
the circuit board has attachment holes extending therethrough;
each of the sockets is attached to the circuit board so that the base portion of the socket is fitted in the attachment hole;
each of the sockets has a receiver hole extending through the base portion; and
the feeder cap is attached to the socket so that the pin portions of the feeder contacts are connected to the plug contacts, when the plug body is inserted in the receiver hole.

6. The apparatus as recited in claim 4, wherein:
each of the plurality of feeder contacts includes a pin portion extending in a direction parallel to a principal surface of the feeder cover;
the plug body is attached to the feeder cap so that the pin portions of the feeder contacts are connected to the plug contacts held on the plug body; and
the feeder cap is attached on an upper surface of the socket.

7. The apparatus as recited in claim 1, wherein:
the sockets comprises a first socket and a second socket;
the circuit board assemblies comprise a first circuit board assembly and a second circuit board assembly;
the first socket is attached to the first circuit board assembly;
the second socket is attached to the second circuit board assembly;
the connection plug is configured to bridge the first socket and the second socket;
the connection plug comprises a connection cover and a plurality of connection contacts;
the connection cover is configured to cover the first socket and the second socket and has first protrusions for the first socket and second protrusions for the second socket; and
each of the connection contacts covers one of the first protrusions and one of the second protrusions and extends between the covered first protrusion and the covered second protrusion, so that each of the connection contacts interconnects one of the primary terminals of the first socket and one of the primary terminals of the second socket when the connection plug is attached to the first socket and the second socket.

8. The apparatus as recited in claim 1, wherein the short-circuit plug comprises:

a short-circuit cover designed to cover an upper surface of the socket, the short-circuit cover having a first protrusion and a second protrusion; and
a short-circuit contact held on the short-circuit cover, the short-circuit contact extending from the first protrusions to, the second protrusion so as to establish a short circuit between the primary terminals of the socket when the short-circuit plug is attached to the socket.

9. The apparatus as recited in claim 1, wherein each of the plurality of types of plugs has an upper surface located at a position lower than that of the electrical/electronic device.

10. The apparatus as recited in claim 1, wherein the plurality of circuit board assemblies have a common shape and structure.

11. The apparatus as recited in claim 1, wherein the circuit boards included in the circuit board assemblies are grouped into at least two types.

12. The apparatus as recited in claim 1, wherein the electrical/electronic device comprises an LED device.

13. The apparatus as recited in claim 12, wherein at least one of the plugs has a top formed of a material that exhibits large suppression effect of diffused light reflection.

14. The apparatus as recited in claim 12, wherein at least one of the plugs has a top formed of a material that exhibits large light reflection effect.

15. A circuit board assembly comprising a circuit board, an electrical/electronic device and a plurality of sockets,
wherein the circuit board has a plurality of wiring portions formed thereon,
wherein the electrical/electronic device is mounted on the circuit board,
wherein the sockets are attached to an upper portion of the circuit board and connected to the electrical/electronic device via the plurality of wiring portions,
wherein the sockets have a common shape and structure that is designed to receive any of a plurality of types of plugs which include a connection plug for connection between the circuit board assembly and another circuit board assembly,
wherein each of the sockets comprises an insulative base portion and at least two primary terminals, the insulative base portion having at least two recesses formed in an upper surface thereof, the at least two primary terminals being held on the base portion so that part of the primary terminals is located within the recesses, the at least two recesses being located so that a center of the socket is interposed therebetween, the at least two primary terminals being connected to the wiring portions of the circuit board to which the socket is attached, the recesses being designed so that types of plugs having protrusions can be fitted in the recesses, and
wherein the plurality of types of plugs include a feeder plug for power supply, a connection plug for connection between two circuit board assemblies, and a short-circuit plug for establishing a short circuit between two electric paths on one circuit board assembly.

16. An apparatus comprising a plurality of types of plugs used for different purposes and a plurality of a circuit board assemblies,
wherein each of the plurality of the circuit board assemblies includes a circuit board, an electrical/electronic device and a plurality of sockets,
wherein the circuit board has a plurality of wiring portions formed thereon,
wherein the electrical/electronic device is mounted on the circuit board, wherein the sockets are attached to an upper portion of the circuit board and connected to the electrical/electronic device via the plurality of wiring portions, wherein the sockets included in all of the plurality of circuit board assemblies have a common shape and structure that is designed to receive any of the plurality of types of plugs, wherein each of the sockets comprises an insulative base portion and at least two primary terminals, the insulative base portion having at least two recesses formed in an upper surface thereof, the at least two primary terminals being held on the base portion so that part of the primary terminals is located within the recesses, the at least two recesses being located so that a center of the socket is interposed therebetween, the at least two primary terminals being connected to the wiring portions of the circuit board to which the socket is attached, each of the plurality of types of plugs having protrusions which are fitted in the recesses, wherein the at least two primary terminals in each of the sockets are arranged symmetrically with respect to the center of the socket and are respectively connected to different ones of the wiring portions, and wherein:
the at least two primary terminals comprise a first primary terminal and a second primary terminal;
the wiring portions include a first wiring portion and a second wiring portion;
each of the sockets further comprises a first auxiliary terminal and a second auxiliary terminal which are arranged symmetrically with respect to the center of the socket;
the first primary terminal and the first auxiliary terminal are connected in common to the first wiring portion; and
the second primary terminal and the second auxiliary terminal are connected in common to the second wiring portion.

17. A circuit board assembly comprising a circuit board, an electrical/electronic device and a plurality of sockets, wherein the circuit board has a plurality of wiring portions formed thereon, wherein the electrical/electronic device is mounted on the circuit board, wherein the sockets are attached to an upper portion of the circuit board and connected to the electrical/electronic device via the plurality of wiring portions, wherein the sockets have a common shape and structure that is designed to receive any of a plurality of types of plugs, wherein each of the sockets comprises an insulative base portion and at least two primary terminals, the insulative base portion having at least two recesses formed in an upper surface thereof, the at least two primary terminals being held on the base portion so that part of the primary terminals is located within the recesses, the at least two recesses being located so that a center of the socket is interposed therebetween, the at least two primary terminals being connected to the wiring portions of the circuit board to which the socket is attached, the recesses being designed so that types of plugs having protrusions can be fitted in the recesses, wherein the at least two primary terminals in each of the sockets are arranged symmetrically with respect to the center of the socket and are respectively connected to different ones of the wiring portions, and wherein:
the at least two primary terminals comprise a first primary terminal and a second primary terminal;
the wiring portions include a first wiring portion and a second wiring portion;
each of the sockets further comprises a first auxiliary terminal and a second auxiliary terminal which are arranged symmetrically with respect to the center of the socket;
the first primary terminal and the first auxiliary terminal are connected in common to the first wiring portion; and
the second primary terminal and the second auxiliary terminal are connected in common to the second wiring portion.

* * * * *